US012625425B2

(12) United States Patent 
Chen et al.

(10) Patent No.: US 12,625,425 B2 
(45) Date of Patent: **\*May 12, 2026**

(54) LITHOGRAPHY MASK

(71) Applicant: Taiwan Semiconductor Manufacturing Company, Ltd., Hsinchu (TW)

(72) Inventors: Chien-Cheng Chen, Hsinchu County (TW); Huan-Ling Lee, Hsinchu County (TW); Ta-Cheng Lien, Hsinchu County (TW); Chia-Jen Chen, Hsinchu County (TW); Hsin-Chang Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,957

(22) Filed: Jan. 3, 2024

(65) Prior Publication Data

US 2024/0134268 A1     Apr. 25, 2024

Related U.S. Application Data

(63) Continuation of application No. 17/321,852, filed on May 17, 2021, now Pat. No. 11,899,357.

(51) Int. Cl. 
*G03F 1/32* (2012.01)

(52) U.S. Cl. 
CPC ..................................... *G03F 1/32* (2013.01)

(58) Field of Classification Search 
CPC ........................................................ G03F 1/32 
See application file for complete search history.

(56) References Cited

U.S. PATENT DOCUMENTS

| | | | | |
|---|---|---|---|---|
| 6,803,158 | B1* | 10/2004 | Gordon | ..................... G03F 1/32 |
| | | | | 430/323 |
| 11,899,357 | B2* | 2/2024 | Chen | ......................... G03F 1/38 |
| 2007/0065731 | A1* | 3/2007 | Ishiwata | .................. G03F 1/42 |
| | | | | 430/394 |
| 2019/0025694 | A1 | 1/2019 | Choi | |

FOREIGN PATENT DOCUMENTS

| | | |
|---|---|---|
| CN | 103650106 A | 1/2019 |
| CN | 110955108 A | 4/2020 |
| TW | 202001407 A | 1/2020 |

* cited by examiner

*Primary Examiner* — Jonathan Johnson 
*Assistant Examiner* — Jayson D Cosgrove 
(74) *Attorney, Agent, or Firm* — Lippes Mathias LLP

(57) ABSTRACT

A mask for use in a semiconductor lithography process includes a substrate, a mask pattern disposed on the substrate, and a light absorbing border surrounding the mask pattern. The light absorbing border is inset from at least two edges of the substrate to define a peripheral region outside of the light absorbing border. In some designs, a first peripheral region extends from an outer perimeter of the light absorbing border to a first edge of the substrate, and a second peripheral region that extends from the outer perimeter of the light absorbing border to a second edge of the substrate, where the first edge of the substrate and the second edge of the substrate are on opposite sides of the mask pattern.

20 Claims, 4 Drawing Sheets

LITHOGRAPHY MASK

This application is a continuation of U.S. application Ser. No. 17/321,852 filed May 17, 2021, now U.S. Pat. No. 11,899,357, which is incorporated herein by reference in its entirety.

BACKGROUND

The following relates to semiconductor manufacturing, masks for use in semiconductor lithography processes, lithography mask fabrication methods, deep ultraviolet (UV) semiconductor lithography, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
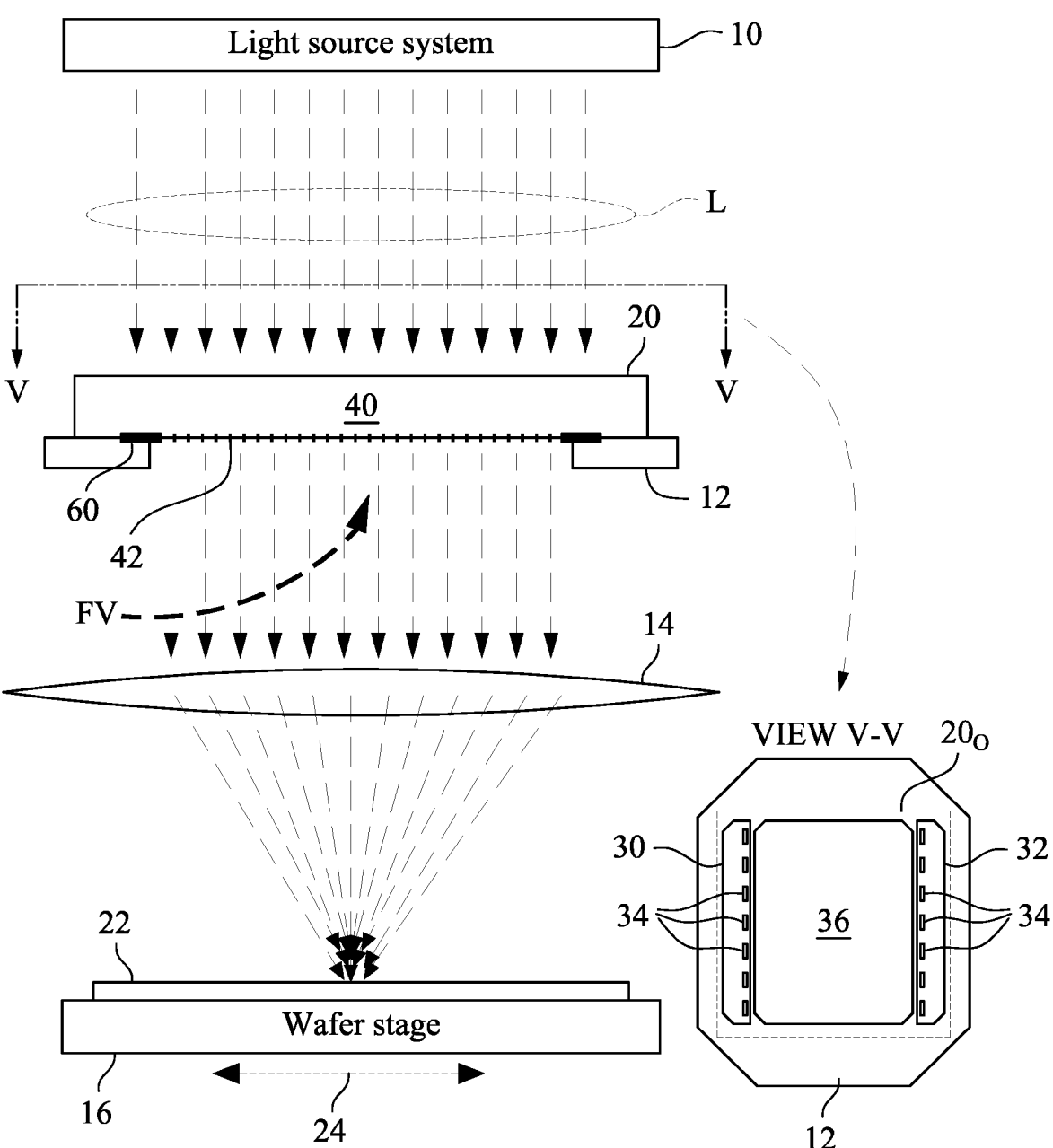
FIG. 1 diagrammatically illustrates a lithography system including a lithography mask.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference to FIG. 1, a non-limiting illustrative semiconductor lithography apparatus is diagrammatically shown, which includes a light source system 10, a mask stage 12 (also sometimes called a reticle stage 12 or other similar nomenclature), an imaging system 14, and a wafer stage 16. The semiconductor lithography is performed using light L generated by the light source system 10 at a lithography wavelength that is chosen based on factors such as the feature size to be lithographically transferred from a mask 20 (also sometimes called a reticle 20 or similar nomenclature) mounted on the mask stage 12 to a semiconductor wafer 22 mounted on the wafer stage 16. For example, the lithography process could employ light L in the visible wavelength range, in which case the lithography wavelength is in the range of 400-700 nm (corresponding to a photon energy range of 1.77 eV to 3.10 eV), or ultraviolet (UV) light in which the lithography wavelength is below 400 nm (corresponding to a photon energy greater than 3.10 eV). In some non-limiting illustrative embodiments, the lithography process is a deep UV semiconductor lithography process, for example using a lithography wavelength of 193 nm in one non-limiting illustrative example, or using a lithography wavelength of 248 nm in another non-limiting illustrative example. In some non-limiting illustrative embodiments, the lithography wavelength is 280 nm or smaller.

The light source system 10 includes a light source suitable for generating light L at the design-basis lithography wavelength. As a non-limiting example, for deep UV semiconductor lithography at 193 nm an excimer laser with argon fluoride (ArF) is a suitable light source. As another non-limiting example, for deep UV semiconductor lithography at 248 nm an excimer laser with krypton fluoride (KrF) is a suitable light source. The light source system 10 optionally also includes optics for shaping the light L to uniformly illuminate the mask 20 mounted on mask stage 12.

With continuing reference to FIG. 1, VIEW V-V diagrammatically shows a downward view indicated by the indicator V-V in the main drawing, showing a top plan view of the mask stage 12 and an outline $20_O$ of the mask 20 disposed on the mask stage 12. As seen in VIEW V-V, the mask stage 12 includes two support pads 30, 32 that support the mask 20 on the mask stage 12. Optionally, a securing mechanism is provided to secure the mask 20 on the support pads 30, 32. For example, the illustrative mask stage 20 includes openings 34 connected to a vacuum pump (not shown) so as to secure the mask 20 on the support pads 30, 32. Such a securing mechanism is sometimes referred to as a vacuum chuck. In other embodiments, the mask 20 may be secured on the support pads 30, 31 by way of an electrostatic chuck comprising electrodes embedded in or forming the support pads 30, 32. In yet other embodiments, an adhesive or the like is used to secure the mask 20 on the support pads 30, 31. The mask stage 12 further includes a central opening 36 that aligns with a central area of the mask 20, as seen by the alignment of the central opening 36 of the mask stage 20 with the mask outline $20_O$.

Returning to the main drawing of FIG. 1 which shows the mask 20 in diagrammatic side-sectional view, the mask 20 includes a substrate 40 on which a mask pattern 42 is disposed. The substrate 40 is transmissive for the light L, so that the light L transmits through the substrate 40 and the mask pattern 42. For example, in some non-limiting illustrative embodiments the substate may be quartz, titanium dioxide (TiO$_2$), doped silicon dioxide (SiO$_2$), or another material that is transparent for the lithography wavelength L. Typically, the mask pattern 42 comprises a patterned light-absorbing layer, such as a metal layer, so that the light L passes through areas of the mask pattern 42 where the light absorbing layer has been removed. For example, in some non-limiting illustrative embodiments the light absorbing layer of the mask pattern 42 may be a metal layer such as chrome, chromium, CrN, CrON, CrCON; or another material that is absorbing for the lithography wavelength L. The imaging system 14 typically includes an objective lens and/or other optical components such as additional lenses and/or mirrors to image the mask pattern 42 onto the surface of the semiconductor wafer 22.

The semiconductor wafer 22 may be a silicon wafer, a silicon-germanium wafer, a gallium arsenide wafer, an indium phosphide wafer, or so forth (these are merely some non-limiting illustrative examples). Depending on the stage of the semiconductor fabrication process, the surface of the semiconductor wafer 22 may include various layers such as thermal or deposited oxide layers, epitaxially deposited layers, metal layers, various combinations, and/or so forth, which may be variously patterned and shaped according to the specific semiconductor device fabrication process work-flow of which the instant semiconductor lithography process is one part. For the subject semiconductor lithography process, the surface of the semiconductor wafer 22 is typically coated with a resist (e.g., photoresist) that is sensitive to the light L at the lithography wavelength, so that the mask pattern imaged onto the resist-coated surface of the semiconductor wafer 22 by the imaging system 14 is pho-tochemically imprinted onto the resist. In a typical semi-conductor lithography workflow, after this exposure the semiconductor wafer 22 is removed from the wafer stage 16 and subsequently the resist is developed using a suitable developer formulation to form openings in the resist by removing portions of the resist that were exposed to the light L (in the case of a positive resist) or by removing portions of the resist that were not exposed to the light L (in the case of a negative resist). The thusly formed openings in the developed resist conform with the imaged mask pattern 42. After the development step, further semiconductor process-ing steps may be performed such as etching an underlying layer through the openings in the developed resist, or applying a coating that adheres in the openings in the developed resist, and/or so forth, after which the resist is stripped off. This is merely a non-limiting illustrative example of one possible semiconductor lithography process workflow, and numerous variants to this workflow are contemplated.

In some non-limiting embodiments, the semiconductor lithography process is performed in a step-and-shoot sequence to form an array of instances of photochemical imprints of the mask pattern 42 on the surface of the semiconductor wafer 22. Such an approach is suitable, for example, as part of a semiconductor fabrication process for forming an array of semiconductor dies on the semiconduc-tor wafer 22. To implement this step-and-shoot sequence, the wafer stage 16 is suitably a step-and-scan stage as diagram-matically indicated by double-headed arrow 24. Typically the step-and-scan stage operates two orthogonal directions (e.g., x- and y-directions), but double-headed arrow 24 only indicates one of these two orthogonal stage movements. At each stage position, a shutter (not shown) opens to briefly expose one location on the surface of the semiconductor wafer 22 to form a photochemical imprint of the imaged mask pattern 42 at that location; the wafer stage 24 then steps the wafer 22 to the next location and this process repeats to form an array of photochemical imprints of the imaged mask pattern 42 extending over the surface of the semiconductor wafer 22.

FIG. 1 merely presents a diagrammatic representation of certain illustrative aspects of a typical semiconductor lithog-raphy apparatus. Additional and/or variant aspects may be included depending on the specific type of semiconductor lithography being performed. For example, the lithography system may be an immersion lithography system in which purified water or other fluid is disposed in the space between the objective lens and the surface of the semiconductor wafer 22, for example to provide improved refractive index matching. Alternatively, the lithography system may be a non-immersion lithography system that does not employ immersion fluid. As another non-limiting illustrative variant, if the lithography wavelength is strongly absorbed by air then the EUV lithography system suitably further includes a vacuum chamber within which the light source system 10, mask stage 12, imaging system 14, and wafer stage 16 are disposed. Such a vacuum environment is suitably used, for example, in extreme ultraviolet (EUV) lithography in which the lithography wavelength is in the EUV range (10-124 nm, corresponding to a photon energy range of 10-124 eV).

With continuing reference to FIG. 1, the mask 20 may optionally further include a pellicle (not shown) disposed over the mask pattern 42. The purpose of the optional pellicle is to space apart any particles falling on the mask surface from the mask pattern 42 that is imaged onto the semiconductor wafer 22. The pellicle thus keeps any such particles out of the focal plane thereby reducing the impact of any such particles on the photochemically imprinted mask pattern.

As previously mentioned, the mask stage 12 includes the central opening 36, best seen in VIEW V-V of FIG. 1, that is aligned with a central area of the mask 20 (as diagram-matically shown by the alignment of the central opening 36 of the mask stage 20 with the mask outline 20$_O$ in VIEW V-V). More specifically, the central opening 36 of the mask stage 20 is aligned with the mask pattern 42 to permit the light L transmitted through the mask pattern 42 to pass through the opening 36 to the imaging system 14. Instead of a central opening 36, in some embodiments the mask stage 12 may include a continuous transparent plate (not shown) made of a material that is transparent for the lithography light L, in which case the transparent plate may extend over the area of the central opening 36.

Figure 2:
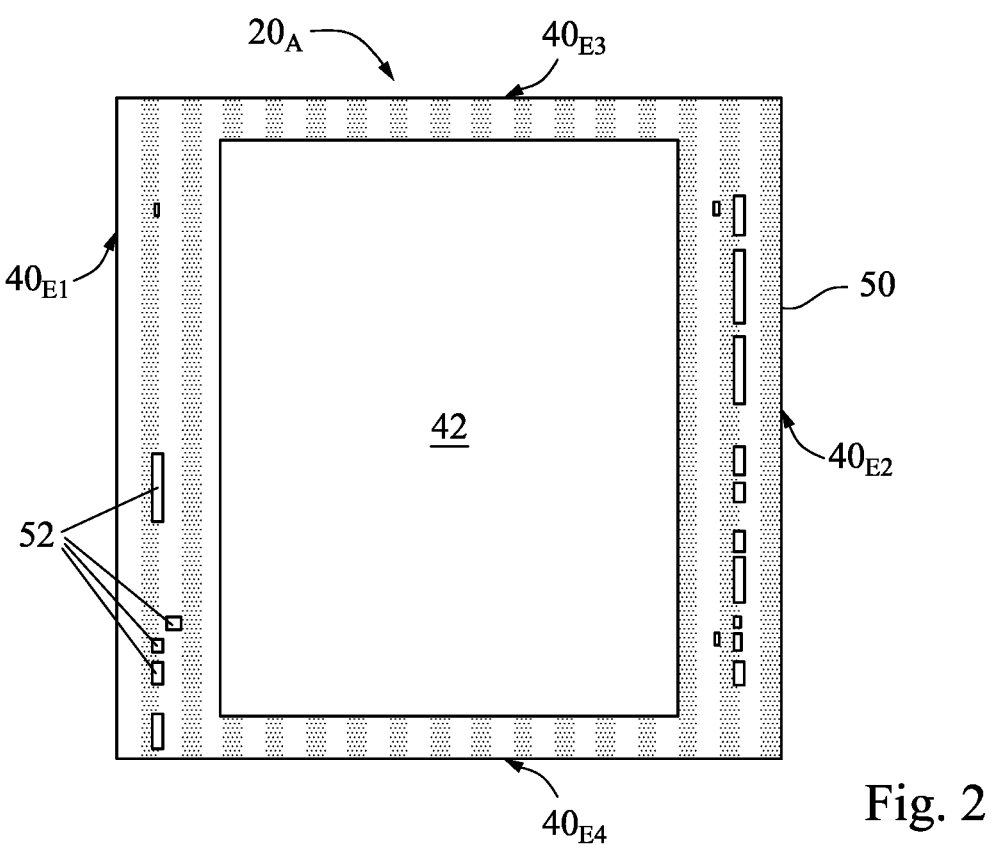
FIG. 2 diagrammatically illustrates a plan view of a lithography mask.

With reference now to FIG. 2, an illustrative mask 20$_A$ shown in FIG. 2 can be mounted on the mask stage 12 of the illustrative semiconductor lithography apparatus of FIG. 1. The view in FIG. 2 is a top plan view of the mask 20$_A$ along the direction FV indicated in FIG. 1. That is, the view of FIG. 2 shows the mask 20$_A$ looking at the surface of the substrate 40 on which the mask pattern 42 is disposed. (Without loss of generality, for convenience hereinafter this surface is referred to as the front surface of the substrate 40). In addition to the mask pattern 42, the mask 20$_A$ further includes a light-absorbing border 50 disposed on the same front surface of the substrate 40 as the mask pattern 42. The light absorbing border 50 surrounds the mask pattern 42.

The light absorbing border 50 comprises a light absorbing layer disposed on the substrate 40 that is absorbing for the light L at the lithography wavelength. For example, in some non-limiting illustrative embodiments the light absorbing layer of the light absorbing border 50 may be a metal layer such as chrome, chromium, CrN, CrON, CrCON; or another material that is absorbing for the lithography wavelength L. In some embodiments, the light absorbing layer making up the light absorbing border 50 is also the same material making up the absorbing regions of the mask pattern 42, with both features being created in a single lithographic exposure/development cycle. For example, starting with a substrate coated with a blanket light absorbing layer and at least one resist layer, a lithographic exposure/development cycle step may be performed to remove portions of the blanket light absorbing layer to define the non-absorbing pattern regions of the mask pattern 42 while leaving other portions of the blanket light absorbing layer to define the absorbing pattern regions, and also leaving portions of the blanket light absorbing layer to define the light absorbing border 50. As seen in FIG. 2, the light absorbing border may include one or more isolated openings (i.e. isolated non-absorbing regions) 52 for various purposes, such as to provide windows for optical sensors (not shown) of the mask stage 12 such as transmission image sensor (TIS), integrated lens interferometer at sensor (ILIAS), or so forth.

In the illustrative mask 20$_A$, the light absorbing border 50 extends to all outermost edges 40$_{E1}$, 40$_{E2}$, 40$_{E3}$, 40$_{E4}$ of the substrate 40 (note that the substrate 40 is shown in side-sectional view in FIG. 1; in the front view of FIG. 2 the edges 40$_{E4}$, 40$_{E2}$, 40$_{E3}$, 40$_{E4}$ of the substrate 40 are indicated.) The light-absorbing border 50 provides certain benefits. For example, the light-absorbing border 50 blocks the light L at the edges of the mask pattern 42 to suppress optical cross-talk between neighboring photochemical imprints of the mask pattern 42 on the surface of the semiconductor wafer 22 when using a step-and-shoot sequence to form an array of photochemical imprints of the mask pattern 42 on the surface of the semiconductor wafer 22. Another benefit is that the light-absorbing border 50 blocks the light from any sensors or other components of the mask stage 12 that might be adversely affected in operation and/or operating lifespan by exposure to the light L.

Having the light-absorbing border 50 extend to all edges 40$_{E4}$, 40$_{E2}$, 40$_{E3}$, 40$_{E4}$ of the substrate 40 can also reduce mask fabrication time. For example, consider the case of a mask fabrication process that starts with a substrate coated with a blanket light absorbing layer and a positive resist layer, in which the lithographic exposure step employs electron beam (E-beam) writing to expose the areas of the resist to be removed. In this case, designing the light-absorbing border 50 to extend to all edges 40$_{E1}$, 40$_{E2}$, 40$_{E3}$, 40$_{E4}$ of the substrate 40 substantially reduces the E-beam writing time, since exposure to the electron beam is in this case only within the mask pattern 42. No E-beam exposure is performed in this case over the relatively large outer area occupied by the light-absorbing border 50, except at any isolated openings 52 that may be formed in the light-absorbing border 50 to accommodate optical sensors or the like.

Figure 3:
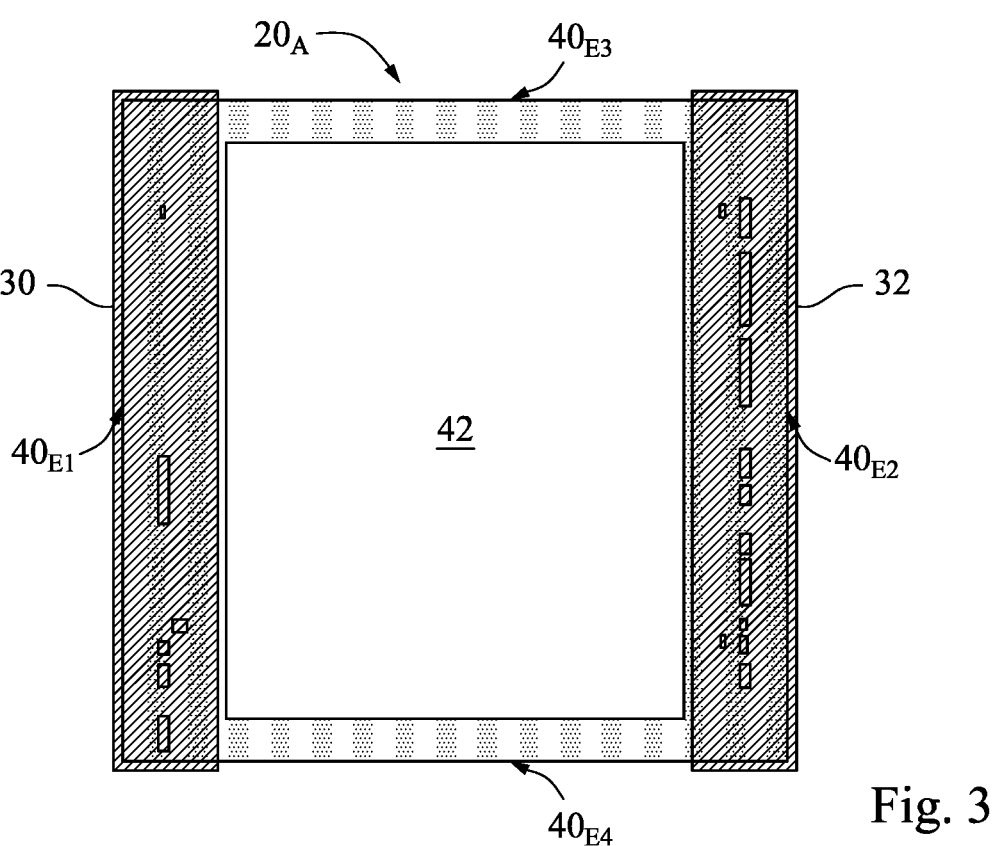
FIG. 3 diagrammatically illustrates the plan view of the lithography mask of FIG. 2, with the support pads of a mask stage diagrammatically indicated.

However, with reference to FIG. 3, it is recognized herein that there is a disadvantage to the mask 20$_A$ of FIG. 2 which has the light-absorbing border 50 extend to all edges 40$_{E1}$, 40$_{E2}$, 40$_{E3}$, 40$_{E4}$ of the substrate 40. FIG. 3 depicts the mask 20$_A$ along the viewing direction denoted by arrow FV in FIG. 1, with the two support pads 30, 32 that support the mask on the mask stage 12 also diagrammatically indicated by hatched areas in FIG. 3. As can be seen, the two support pads 30, 32 contact a large area of the light absorbing border 50. It is recognized herein that the two support pads 30, 32 can stick to the light absorbing border 50. For example, if the support pads 30, 32 are metal and the light absorbing border 50 is made of a metal or metal alloy such as chrome, chromium, CrN, CrON, CrCON, or so forth, then a cold weld can form between the metal support pads 30, 32 and the light absorbing border 50. This can result in wear and/or damage to the mask 20$_A$ and/or the mask stage 12 in various ways. For example, some of the metal or metal alloy of the light absorbing border 50 may be left on the support pads 30, 32 when the mask 20$_A$ is unloaded from the mask stage 12. This can leave undesirable openings in the light absorbing border 50 of the mask 20$_A$ where the metal or metal alloy was lifted off, and also leaves metal or metal alloy residue on the support pads 30, 32 of the mask stage 12. The breaking of the cold welds could also result in an undesirably high force being applied to perform forced unloading of the mask 20$_A$ if it is cold welded to the mask stage 12. This high force could cause mask 20$_A$ breakage, and/or could cause the mask stage 12 to break or undergo stress that reduces the operating lifetime of the mask stage. Breaking the cold weld could also dislodge particles from the mask and/or mask stage, which could contaminate the lithography system.

Figure 4:
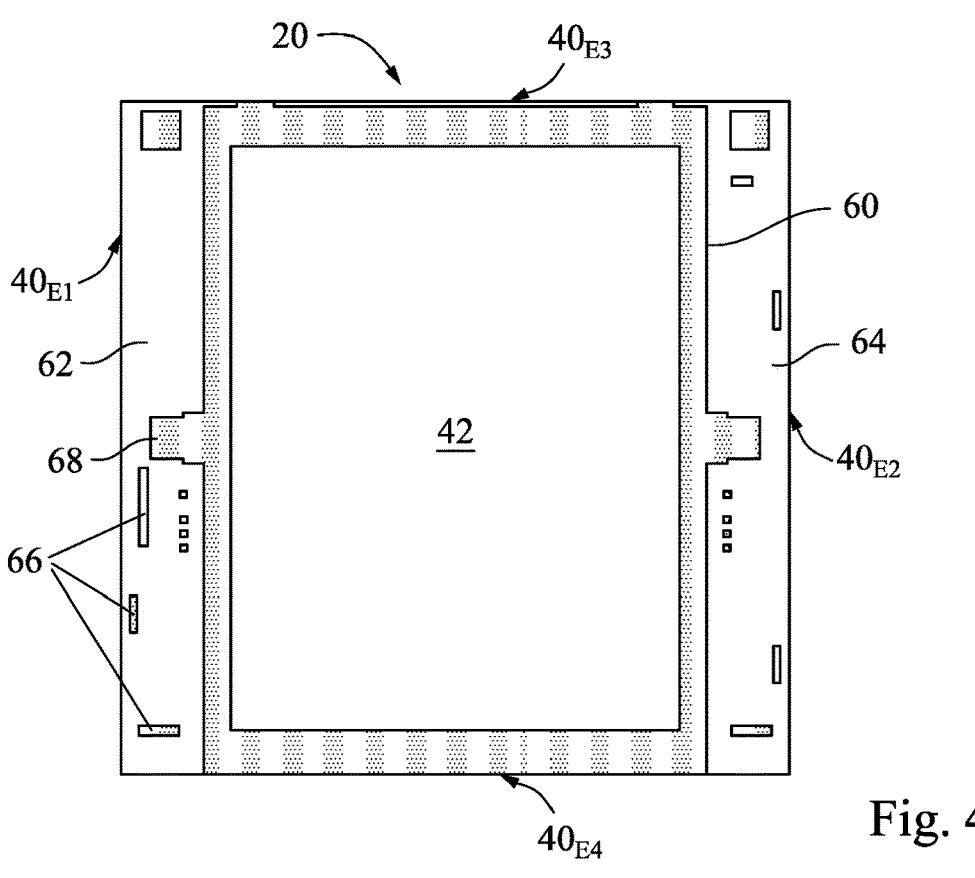
FIG. 4 diagrammatically illustrates a plan view of a lithography mask with a reduced light-absorbing border.

With reference to FIG. 4, a mask 20 is shown which reduces or eliminates the problem of the light absorbing border 50 causing the mask 20$_A$ of FIG. 2 to cold weld to or otherwise stick to the support pads 30, 32 of the mask stage 12. As with the mask 20$_A$ of FIG. 2, the mask 20 of FIG. 4 includes the mask pattern 42 disposed on the substrate 40 (which is seen in FIG. 1), and includes a light absorbing border 60 surrounding the mask pattern 42. The light absorbing border 60 again comprises a light absorbing layer disposed on the substrate 40 that is absorbing for the light L at the lithography wavelength. However, the mask 20 of FIG. 4 differs from the mask 20$_A$ of FIG. 2 in that the light absorbing border 60 is inset from two edges 40$_{E1}$, 40$_{E2}$ of the substrate 40 to define a peripheral region 62, 64 outside of the light absorbing border 60. The peripheral regions 62, 64 do not include the light absorbing layer that makes up the light absorbing border 60. The illustrative peripheral region 62, 64 extends from an outer perimeter of the light absorbing border 60 to an edge 40$_{E1}$, 40$_{E2}$ of the substrate 40. As with the mask 20$_A$ of FIG. 2, the light absorbing border 60 of the mask 20 of FIG. 4 may in some non-limiting illustrative embodiments be chrome, chromium, CrN, CrON, CrCON, or another material that is absorbing for the lithography wavelength L. In some embodiments, the light absorbing layer making up the light absorbing border 60 is also the same material making up the absorbing regions of the mask pattern 42, with both features being created in a single lithographic exposure/development cycle. For example, starting with a substrate coated with a blanket light absorbing layer and at least one resist layer, a lithographic exposure/development cycle may be performed to remove portions of the blanket light absorbing layer to define the non-absorbing pattern regions of the mask pattern 42 and also the peripheral regions 62, 64; while leaving other portions of the blanket light absorbing layer to define the absorbing pattern regions of the mask pattern 42, and also leaving portions of the blanket light absorbing layer to define the light absorbing border 60.

Figure 5:
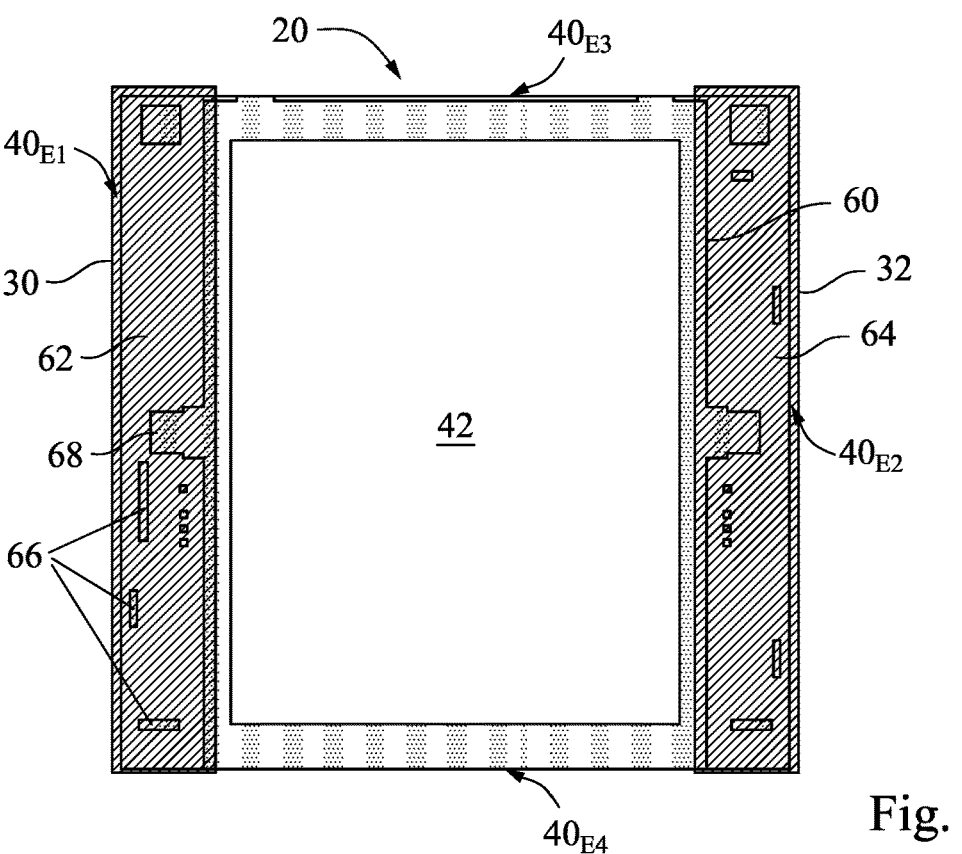
FIG. 5 diagrammatically illustrates the plan view of the lithography mask of FIG. 4 with the reduced light-absorbing border, with the support pads of a mask stage diagrammatically indicated.

With reference to FIG. 5, the mask 20 of FIG. 4 is again shown along the viewing direction denoted by arrow FV in FIG. 1, with the two support pads 30, 32 that support the mask 20 on the mask stage 12 also diagrammatically indicated by hatched areas in FIG. 5. It is seen that in the case of the mask 20 the two support pads 30, 32 contact a much reduced area of the light absorbing border 60, as compared with the much larger area of the light absorbing border 50 of the mask 20$_A$ that is contacted by the support pads 30, 32 (cf. FIG. 3). This reduced contact area is also diagrammatically indicated in FIG. 1 where the reduced-width border 60 of the mask 20 is shown in diagrammatic side sectional view.

In the illustrative example of FIG. 5, there is some overlap between the light absorbing border 60 and the support pads 30, 32, but this area is much smaller than the overlap between the light absorbing border 50 of the mask 20$_A$ of FIG. 2 and the support pads 30, 32. Although not shown, in some variant embodiments it is contemplated that there may be no overlap at all between the light absorbing border 60 and the support pads 30, 32.

Because of the much reduced contact area between the light absorbing border 60 of the mask 20 which is inset from the two edges 40$_{E1}$, 40$_{E2}$ of the substrate 40 that are aligned with the support pads 30, 32, the likelihood of the light absorbing border 60 of the mask 20 forming a cold weld or otherwise sticking to the support pads 30, 32 is greatly reduced as compared with the wider border 50 of the mask 20$_A$. Most of the area of contact between the mask 20 and the support pads 30, 32 is taken up by the peripheral region 62, 64. In the peripheral region 62, 64, the support pads 30, 32 contact the substrate 40, or possibly an optional overlayer (not shown) disposed on the substrate that is transmissive for the light L at the lithography wavelength. In some non-limiting illustrative embodiments, the substrate material is quartz, $TiO_2$, doped $SiO_2$, or so forth. These (and most other typical) substrate materials are not metal and generally do not form a cold weld with the metallic support pads 30, 32, and generally do not otherwise stick to the support pads 30, 32. Hence, the problem of the light absorbing border causing the mask to cold weld to or otherwise stick to the support pads of the mask stage is reduced or eliminated, and consequently wear and/or damage to the mask 20 and/or the mask stage 12 is reduced as compared with mask 20$_A$.

In the illustrative examples, the mask stage 12 has the illustrative two support pads 30, 32 that support the mask 20 on the mask stage 12. This is a typical configuration, as the two support pads 30, 32 supporting the mask 20 near the opposite edges 40$_{E1}$, 40$_{E2}$ of the mask 20 provide sufficient and balanced support for the mask 20 on the mask stage 12. Consequently, in the illustrative embodiment it is sufficient to inset the light absorbing border 60 from these two edges 40$_{E1}$, 40$_{E2}$ leaving the illustrative two peripheral regions 62, 64 proximate to the two edges 40$_{E1}$, 40$_{E2}$.

As seen in FIGS. 4 and 5 the light absorbing border 60 is not inset from the other two edges 40$_{E3}$, 40$_{E4}$, since the portions of the light absorbing border 60 proximate to these edges 40$_{E3}$, 40$_{E4}$ do not contact the support pads 30, 32. Leaving intact the border portions proximate to these edges 40$_{E3}$, 40$_{E4}$ can be beneficial because it can reduce fabrication time. In embodiments in which both the mask pattern 42 and the peripheral regions 62, 64 are created in a single lithographic exposure/development cycle which involves E-beam writing to expose the areas of the resist to be removed, the area of the peripheral regions 62, 64 is written by the E-beam. Hence, it is beneficial in these embodiments to provide the two peripheral regions 62, 64 where the support pads 30, 32 contact the mask 20, but to leave the regions of the light absorbing border 60 extending up to the edges 40$_{E3}$, 40$_{E4}$ where the support pads do not contact the mask 20, as this reduces the E-beam writing time.

On the other hand, if a variant mask stage is employed which has contact pads that contact areas proximate to three or even all four edges of the mask, then the light absorbing border may be inset from each of the three or four of the edges proximate to the contact pads, leaving three or even four peripheral regions (variant not shown).

The sides of the light absorbing border 60 of the mask 20 of FIG. 4 parallel with the substate edges 40$_{E4}$, 40$_{E2}$ is narrower than the corresponding sides of the light absorbing border 50 of the mask 20$_A$ of FIG. 2. However, the light absorbing border 60 of the mask 20 of FIG. 4 should perform the same functions as the light absorbing border 50 of the mask 20$_A$ of FIG. 2. These functions include blocking the light L at the edges of the mask pattern 42 to suppress optical cross-talk between neighboring photochemical imprints of the mask pattern 42 on the surface of the semiconductor wafer 22 when using a step-and-shoot sequence; and blocking the light from any sensors or other components of the mask stage 12 that might be adversely affected in operation and/or operating lifespan by exposure to the light L.

To achieve the first function of suppressing cross-talk between neighboring photochemical imprints, the light absorbing border 60 suitably surrounds the mask pattern 42 on all four sides, as see in FIG. 4. Additionally, the width of the light absorbing border 60 on each side should be sufficient to provide the cross-talk suppression. The minimum width to provide the cross-talk suppression can be determined by ray trace modeling of the lithography system, or can be determined empirically by fabricating several test masks with varying border widths and performing test step-and-shoot lithography sequences to determine the optimal minimum width. In some nonlimiting illustrative embodiments, the width of the peripheral region 62, 64 extending from the outer perimeter of the light absorbing border 60 to the edge 40$_{E1}$, 40$_{E2}$ of the substrate is at least three times a width of the light absorbing border 60. In some nonlimiting illustrative embodiments, an area of peripheral region 62, 64 is at least twice an area of the light absorbing border 60.

To achieve the second function of blocking light L from any light-averse sensors or other components of the mask stage 12, one or more isolated light absorbing regions 66 optionally may be located in peripheral region 62, 64, with each isolated light absorbing regions 66 surrounded by the peripheral region 62, 64. The light absorbing layer comprising the light absorbing border 60 is thus disposed on the substate 40 in each of the isolated light absorbing regions 66. Fabrication of the isolated light absorbing regions 66 can be suitably accomplished during the exposure/development cycle that defines the mask pattern 42 and the light absorbing border 60 by not performing E-beam writing in the regions that become the isolated light absorbing regions 66. In a variant approach, one or more such light-absorbing regions 68 may connect with the light absorbing border 60, rather than being isolated therefrom. While the optional isolated and/or connected light absorbing regions 66, 68 increase the contact area with the support pads 30, 32, the total contact area is nonetheless greatly reduced as compared with the wider light absorbing border 50 of the mask 20$_A$ of FIG. 2.

Figure 6:
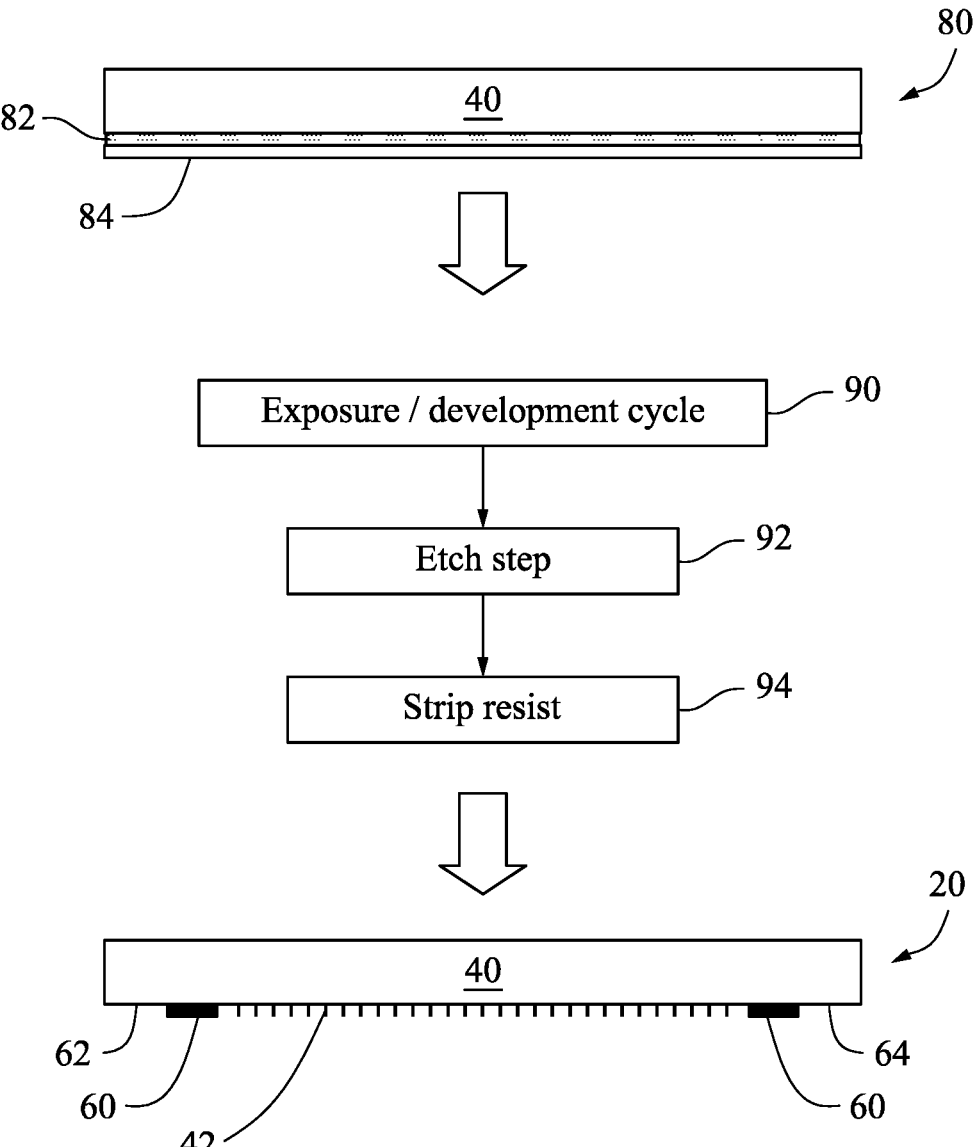
FIG. 6 diagrammatically illustrates a mask fabrication method.

With reference now to FIG. 6, an illustrative method is described for making a mask with a substrate 40, a mask pattern 42 disposed on the substrate, and a light absorbing border 60 surrounding the mask pattern 42; in which the light absorbing border 60 comprises a light absorbing layer disposed on the substrate 40 that is absorbing for the light L at the lithography wavelength; and in which a peripheral region 62, 64 is located outside of the light absorbing border 60 on at least two sides of the light absorbing border 60, where the light absorbing layer not disposed on the substrate in the peripheral region. The method includes providing a mask blank 80 that includes a substrate 40 (which will be the substrate 40 of the fabricated mask 20) coated with a light absorbing layer 82 and a resist layer 84.

An exposure/development cycle 90 is performed as follows. E-beam writing is performed to expose selected portions of the resist layer 84. This is optionally followed by a post-exposure bake (PEB) which may be performed depending on the type of resist making up the resist layer 84. After the E-beam writing and optional PEB, the resist is developed using a chemical developer designed to develop the type of resist making up the resist layer 84. If the resist layer 84 is a positive resist then the chemical developer removes the resist in those areas that were exposed to the E-beam during the E-beam writing. Alternatively, if the resist layer 84 is a negative resist then the chemical developer removes the resist in those areas that were not exposed to the E-beam during the E-beam writing. In a variant embodiment, the E-beam writing is replaced by a photolithographic step in which light is applied to expose the selected portions of the resist layer 84. (In this variant embodiment, the resist layer 84 comprises a photoresist). The exposure/development cycle 90 operates to form openings in the resist layer 84 to selectively expose the light absorbing layer 82 in the regions of the mask pattern 42 that are to be open (that is, not coated with the light absorbing layer) and also the peripheral areas 62, 64.

With continuing reference to FIG. 6, in an etch step 92 the portions of the light absorbing layer 82 exposed by the openings in the resist layer 84 that were formed by the exposure/development cycle 90 are removed. The etch step 92 may use chemical etching, plasma etching (e.g., reactive-ion etching, RIE), or any other etching technique that is operative to etch the chrome, chromium, CrN, CrON, CrCON, or other material making up the light absorbing layer 82. The etch step 92 thus forms the regions of the mask pattern 42 that are to be open (that is, not coated with the light absorbing layer) and also the peripheral areas 62, 64. After the etch step 92, in an operation 94 the resist is stripped, leaving the mask 20 including the pattern area 42 and the light absorbing border 60 and the peripheral region 62, 64 located outside of the light absorbing border 60 on at least two sides of the light absorbing border 60.

Advantageously, the method of FIG. 6 forms the desired peripheral areas 62, 64 in the same process sequence 90, 92, 94 that forms the mask pattern 42. Consequently, manufacturing time for the mask is increased only by the additional E-beam writing time involved in exposing the areas of the light absorbing layer 82 that will be removed in the etch step 92 to form the peripheral areas 62, 64. Formation of the peripheral areas 62, 64 advantageously does not entail an additional exposure/development cycle, and does not entail an additional etch step.

The mask fabrication process for fabricating the mask 20 is a simplified illustrative example, and a given mask fabrication process may optionally include additional fabrication steps. By way of one non-limiting example, if the mask pattern 42 is to be fabricated as an attenuated phase shift mask (APSM) pattern in which a thickness of the light absorbing layer disposed in the absorbing pattern regions is not uniform, then additional mask fabrication steps may precede the illustrated exposure/development cycle 90. These preceding fabrication steps may include a first exposure/development cycle (preceding the exposure/development cycle 90) in which openings in a resist are formed through which the light absorbing layer 82 is thinned in some areas of the mask pattern to produce a thickness variation of the light absorbing layer in the mask pattern. In the final APSM mask pattern, the thickness variation provides interference of the light L that improves contrast in the photochemical imprints of the mask pattern 42 on the surface of the semiconductor wafer 22.

In the following, some additional embodiments are described.

In a nonlimiting illustrative embodiment, a mask is disclosed for use in a semiconductor lithography process performed using light at a lithography wavelength. The mask includes a substrate, a mask pattern disposed on the substrate, and a light absorbing border surrounding the mask pattern. The light absorbing border comprises a light absorbing layer disposed on the substrate that is absorbing for the light at the lithography wavelength. A peripheral region is located outside of the light absorbing border on at least two sides of the light absorbing border. The light absorbing layer is not disposed on the substrate in the peripheral region.

In a nonlimiting illustrative embodiment, a semiconductor lithography system is disclosed for performing a semiconductor lithography process using light at a lithography wavelength. The semiconductor lithography system includes a mask as set forth in the immediately preceding paragraph, a wafer stage configured to hold a semiconductor wafer, a mask stage configured to secure the mask to the mask stage at the peripheral region, and a light source system configured to image the mask pattern of the mask secured to the mask stage onto the semiconductor wafer held by the wafer stage.

In a nonlimiting illustrative embodiment, a mask is disclosed for use in a semiconductor lithography process performed using light at a lithography wavelength. The mask includes a substrate, a mask pattern disposed on the substrate, and a light absorbing border surrounding the mask pattern. The light absorbing border comprises a light absorbing layer disposed on the substrate that is absorbing for the light at the lithography wavelength. A peripheral region is located outside of the light absorbing border on at least two sides of the light absorbing border. The light absorbing layer is not disposed on the substrate in the peripheral region. The peripheral region extends from an outer perimeter of the light absorbing border to an edge of the substrate.

In a nonlimiting illustrative embodiment, a mask fabrication process includes: providing a substrate coated with a light absorbing layer and a resist layer; and performing an exposure/development cycle and an etch step to remove portions of the light absorbing layer to define (i) non-absorbing pattern regions of a mask pattern surrounded by a light absorbing border and (ii) a peripheral region outside of the light absorbing border in which the light absorbing layer is removed by the exposure/development cycle.

In a nonlimiting illustrative embodiment, a mask for use in a semiconductor lithography process is disclosed. The mask includes a substrate, a mask pattern disposed on the substrate, and a light absorbing border surrounding the mask pattern. The light absorbing border is inset from at least two edges of the substrate to define a peripheral region outside of the light absorbing border.

In a nonlimiting illustrative embodiment, a method of manufacturing a mask for use in a semiconductor lithography process performed using light at a lithography wavelength is disclosed. The method includes providing a substrate coated with a light absorbing layer that is absorbing for the light at the lithography wavelength, and removing portions of the light absorbing layer to form a mask pattern and a light absorbing border on the substrate. The light absorbing border surrounds the mask pattern. The light absorbing border comprises a portion of the light absorbing layer that is not removed. The removing includes removing portions of the light absorbing layer on at least two sides of the light absorbing border to define a peripheral region.

A semiconductor lithography method includes mounting a mask fabricated according to the immediately preceding paragraph on a mask stage, where the peripheral region contacts support pads of the mask stage; performing semiconductor lithography using light at the lithography wavelength passing through the mask; and, after performing the semiconductor lithography, removing the mask from the mask stage. Advantageously, the removal of the light absorbing layer in the peripheral region reduces or eliminates likelihood of a cold weld forming between the mask and the contact support pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a mask for use in a semiconductor lithography process performed using light at a lithography wavelength, the method comprising:
  providing a substrate coated with a light absorbing layer that is absorbing for the light at the lithography wavelength; and
  removing portions of the light absorbing layer to form a mask pattern and a light absorbing border on the substrate;
  wherein the light absorbing border surrounds the mask pattern, the light absorbing border comprising a portion of the light absorbing layer that is not removed;
  wherein the removing includes removing portions of the light absorbing layer on at least two opposite sides of the light absorbing border to define a peripheral region, wherein the light absorbing border extends to at least one edge of the substrate; and
  the removing includes:
    disposing a positive resist layer on the light absorbing layer;
    performing electron beam writing to expose portions of the positive resist layer corresponding to the portions of the light absorbing layer to be removed including performing the electron beam writing to expose the peripheral region;
    developing the positive resist layer after the electron beam writing to form openings in the positive resist corresponding to the portions of the light absorbing layer to be removed; and
    etching the portions of the light absorbing layer to be removed through the openings in the positive resist.

2. The method of claim 1 wherein the peripheral region extends from an outer perimeter of the light absorbing border to an edge of the substrate.

3. The method of claim 2 wherein a width of the peripheral region extending from the outer perimeter of the light absorbing border to the edge of the substrate is at least three times a width of the light absorbing border.

4. The method of claim 1 wherein the peripheral region includes:

a first peripheral region that extends from an outer perimeter of the light absorbing border to a first edge of the substrate; and
  a second peripheral region that extends from the outer perimeter of the light absorbing border to a second edge of the substrate;
  wherein the first edge of the substrate and the second edge of the substrate are on opposite sides of the mask pattern.

5. The method of claim 1 wherein an area of the peripheral region is at least twice an area of the light absorbing border.

6. The method of claim 1 wherein:
  the removing forms one or more isolated light absorbing regions each surrounded by the peripheral region, the light absorbing layer not being removed in the one or more isolated light absorbing regions.

7. The method of claim 1 wherein the lithography wavelength is 280 nm or smaller.

8. The method of claim 1 wherein the substrate is light transmissive for the light at the lithography wavelength.

9. The method of claim 1 wherein the light absorbing layer is a metal layer.

10. The method of claim 1 wherein the light absorbing layer comprises chromium.

11. The method of claim 10 wherein the substrate comprises quartz, titanium dioxide ($TiO_2$), or doped silicon dioxide ($SiO_2$).

12. The method of claim 1 wherein the removing forms the mask pattern comprising absorbing pattern regions in which the light absorbing layer is not removed and non-absorbing regions in which the light absorbing layer is removed by the removing.

13. The method of claim 12 further comprising:
  prior to the removing, performing an exposure/development cycle and an etch to produce a thickness variation of the light absorbing layer in the mask pattern;
  wherein the mask pattern comprises an attenuated phase shift mask (APSM) pattern in which a thickness of the light absorbing layer disposed in the absorbing pattern regions is not uniform.

14. A semiconductor lithography method comprising:
  mounting a mask fabricated according to claim 1 on a mask stage wherein the peripheral region contacts support pads of the mask stage;
  performing semiconductor lithography using light at the lithography wavelength passing through the mask; and
  after performing the semiconductor lithography, removing the mask from the mask stage.

15. A mask fabrication process comprising:
  providing a substrate coated with a light absorbing layer and a positive resist layer; and
  performing an exposure/development cycle and an etch step to remove portions of the light absorbing layer to define (i) non-absorbing pattern regions of a mask pattern surrounded by a light absorbing border, wherein the light absorbing border extends to at least one edge of the substrate, and (ii) a peripheral region outside of the light absorbing border in which the light absorbing layer is removed by the exposure/development cycle;
  wherein the exposure/development cycle includes performing electron beam writing to expose portions of the positive resist layer to be removed by the etch step including exposing the portions of the positive resist layer in both the non-absorbing pattern regions and the peripheral region.

16. The mask fabrication process of claim 15 wherein the mask fabrication process is an attenuated phase shift mask (APSM) fabrication process that further comprises:

a first exposure/development cycle and a first etch step performed before the exposure/development cycle, the first exposure/development cycle and the first etch step to produce a thickness variation of the light absorbing layer in the mask pattern.

17. A method of manufacturing a mask for use in a semiconductor lithography process performed using light at a lithography wavelength, the method comprising:

providing a substrate with a light absorbing layer disposed directly on the substrate that is absorbing for the light at the lithography wavelength; and removing portions of the light absorbing layer to form a mask pattern and a light absorbing border on the substrate;

wherein the light absorbing border surrounds the mask pattern, the light absorbing border comprising a portion of the light absorbing layer that is not removed;

wherein the removing includes removing portions of the light absorbing layer on at least two sides of the light absorbing border to define a peripheral region in which the substrate is exposed; and the removing includes:

disposing a positive resist layer on the light absorbing layer;

performing electron beam writing to expose portions of the positive resist layer corresponding to the portions of the light absorbing layer to be removed including performing the electron beam writing to expose the peripheral region;

developing the positive resist layer after the electron beam writing to form openings in the positive resist corresponding to the portions of the light absorbing layer to be removed; and etching the portions of the light absorbing layer to be removed through the openings in the positive resist.

18. The method of claim 17, wherein a width of the peripheral region extending from the outer perimeter of the light absorbing border to the edge of the substrate is at least three times a width of the light absorbing border.

19. The method of claim 17, wherein the light absorbing layer comprises chromium.

20. The method of claim 17, wherein the substrate comprises quartz, titanium dioxide ($TiO_2$), or doped silicon dioxide ($SiO_2$).

* * * * *